United States Patent
Lee et al.

(10) Patent No.: US 10,367,029 B2
(45) Date of Patent: Jul. 30, 2019

(54) IMAGE SENSORS HAVING A SEPARATION IMPURITY LAYER

(71) Applicant: Samsung Electronics Co., Ltd., Suwon-si, Gyeonggi-do (KR)

(72) Inventors: Haewon Lee, Yongin-si (KR); Sangjoo Lee, Seongnam-si (KR); Moosup Lim, Yongin-si (KR); Younghwan Park, Namyangju-si (KR); Dongjoo Yang, Seongnam-si (KR); Kang-Sun Lee, Hwaseong-si (KR); Jiwon Lee, Daegu (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/800,376

(22) Filed: Nov. 1, 2017

(65) Prior Publication Data
US 2018/0190709 A1 Jul. 5, 2018

(30) Foreign Application Priority Data
Jan. 3, 2017 (KR) .................. 10-2017-0000837

(51) Int. Cl.
*H01L 31/02* (2006.01)
*H04N 5/374* (2011.01)
(Continued)

(52) U.S. Cl.
CPC .... *H01L 27/14654* (2013.01); *H01L 27/1463* (2013.01); *H01L 27/14607* (2013.01);
(Continued)

(58) Field of Classification Search
CPC ......... H01L 27/14654; H01L 27/14612; H01L 31/02019; H01L 27/1463; H01L 27/146;
(Continued)

(56) References Cited

U.S. PATENT DOCUMENTS 8,077,238 B2 12/2011 Hong et al.
8,633,524 B2 * 1/2014 Nomoto ............ H01L 27/14603
257/292
(Continued)

FOREIGN PATENT DOCUMENTS

KR 2008-0015309 A 2/2008

*Primary Examiner* — Alexander O Williams
(74) *Attorney, Agent, or Firm* — Harness, Dickey & Pierce, P.L.C.

(57) ABSTRACT

An image sensor includes a separation impurity layer in a semiconductor layer and defining a photoelectric conversion region and a readout circuit region, a photoelectric conversion layer in the semiconductor layer of the photoelectric conversion region and surrounded by the separation impurity layer, a floating diffusion region spaced apart from the photoelectric conversion layer and in the semiconductor layer of the photoelectric conversion region, a transfer gate electrode between the photoelectric conversion layer and the floating diffusion region, and impurity regions in the semiconductor layer of the readout circuit region. When the photoelectric conversion layer is integrated with photocharges, the separation impurity layer has a first potential level around the photoelectric conversion layer and a second potential level on a portion between the photoelectric conversion layer and the impurity regions of the readout circuit region. The second potential level is greater than the first potential level.

20 Claims, 14 Drawing Sheets

(51) Int. Cl.
*H04N 5/378* (2011.01)
*H01L 27/146* (2006.01)

(52) U.S. Cl.
CPC .. *H01L 27/14612* (2013.01); *H01L 31/02019* (2013.01); *H04N 5/374* (2013.01); *H04N 5/378* (2013.01)

(58) Field of Classification Search
CPC ... H01L 31/02; H01L 27/14607; H04N 5/378; H04N 5/374
USPC ........................................................ 257/230
See application file for complete search history.

(56) References Cited

U.S. PATENT DOCUMENTS

| | | | |
|---|---|---|---|
| 8,786,044 B2 * | 7/2014 | Mishima | H01L 27/1462 257/462 |
| 8,878,266 B2 | 11/2014 | Lim | |
| 8,946,795 B2 | 2/2015 | Chen et al. | |
| 9,041,837 B2 | 5/2015 | Li | |
| 9,070,802 B2 | 6/2015 | Wu et al. | |
| 9,159,753 B2 | 10/2015 | Hynecek | |
| 9,277,195 B2 | 3/2016 | Chiu et al. | |
| 9,472,678 B2 * | 10/2016 | Yamazaki | H01L 27/0886 |
| 9,570,506 B2 * | 2/2017 | Endo | H01L 31/0264 |
| 9,653,479 B2 * | 5/2017 | Miyairi | H01L 21/8258 |
| 9,685,560 B2 * | 6/2017 | Yamazaki | H01L 29/7869 |
| 9,893,114 B2 * | 2/2018 | Endo | H01L 27/14685 |
| 9,947,801 B2 * | 4/2018 | Yamazaki | H01L 29/78693 |
| 10,050,153 B2 * | 8/2018 | Koezuka | H01L 29/66969 |

* cited by examiner

IMAGE SENSORS HAVING A SEPARATION IMPURITY LAYER

CROSS-REFERENCE TO RELATED APPLICATIONS

This U.S. nonprovisional patent application claims priority under 35 U.S.C. § 119 of Korean Patent Application No. 10-2017-0000837 filed on Jan. 3, 2017, the entire contents of which are hereby incorporated by reference.

BACKGROUND

Inventive concepts relate to an image sensor, and more particularly, to an image sensor having enhanced blooming characteristics.

Image sensors may convert optical images into electrical signals. Advances in computer and communication industries have led to increasing desires for high performance image sensors in various consumer electronic devices, such as digital cameras, camcorders, PCSs (Personal Communication Systems), game devices, security cameras, medical micro cameras, and/or other consumer electronics.

The images sensors may broadly be classified into CCD (Charge Coupled Device) and CMOS image sensors (CIS). For example, the CIS has a simple operating method and a size of the CIS product is possibly reduced and/or minimized since the CIS's signal processing circuit is integrated into a single chip. Further, the CIS may require relatively small power consumption, which may be useful in battery-powered application. Accordingly, the use of the CIS has been increasing as a result of advanced in technology and implementation of high resolution.

SUMMARY

Embodiments of inventive concepts provide an image sensor having more enhanced optical characteristics.

Example embodiments of inventive concepts are not limited to the above-mentioned one, other objects which have not been mentioned above will be clearly understood to those skilled in the art from the following description.

According to some example embodiments of inventive concepts, an image sensor may include a semiconductor layer of a first conductivity, a separation impurity layer of the first conductivity, the separation impurity layer in the semiconductor layer and defining a photoelectric conversion region and a readout circuit region, a photoelectric conversion layer of a second conductivity, the photoelectric conversion layer in the semiconductor layer of the photoelectric conversion region and surrounded by the separation impurity layer, and a floating diffusion region of the second conductivity, the floating diffusion region spaced apart from the photoelectric conversion layer and in the semiconductor layer of the photoelectric conversion region. The image sensor further includes a transfer gate electrode between the photoelectric conversion layer and the floating diffusion region and impurity regions of the second conductivity, the impurity regions in the semiconductor layer of the readout circuit region. In response to the photoelectric conversion layer being integrated with photo charges, the separation impurity layer is configured to have a first potential level around the photoelectric conversion layer and a second potential level on a portion between the photoelectric conversion layer and the impurity regions of the readout circuit region, the second potential level being greater than the first potential level.

According to some example embodiments of inventive concepts, an image sensor may include a semiconductor layer of a first conductivity, a separation impurity layer of the first conductivity, the separation impurity layer in the semiconductor layer and defining a photoelectric conversion region and a readout circuit region, photoelectric conversion layers of a second conductivity, the photoelectric conversion layers in the semiconductor layer of the photoelectric conversion region and surrounded by the separation impurity layer, a floating diffusion region of the second conductivity, the floating diffusion region spaced apart from the photoelectric conversion layers and in the semiconductor layer of the photoelectric conversion region, transfer gate electrodes between the photoelectric conversion layers and the floating diffusion region, and impurity regions of the second conductivity, the impurity regions in the semiconductor layer of the readout circuit region. In response to the photoelectric conversion layers being integrated with photo-charges, overflowing charges are drained through a first charge path from the photoelectric conversion layers into the floating diffusion region and through a second charge path from the photoelectric conversion layers into the impurity regions of the second conductivity of the readout circuit region.

According to some example embodiments of inventive concepts, an image sensor may include a semiconductor layer of a first conductivity, a separation impurity layer of the first conductivity, the separation impurity layer in the semiconductor layer and defining a photoelectric conversion region and a readout circuit region, a first photoelectric conversion layer of a second conductivity, the first photoelectric conversion layer in the semiconductor layer of the photoelectric conversion region and surrounded by the separation impurity layer, a second photoelectric conversion layer of the second conductivity, the second photoelectric conversion layer in the semiconductor layer of the photoelectric conversion region, the second photoelectric conversion layer adjacent to the first photoelectric conversion layer, a first common floating diffusion region of the second conductivity, the first common floating diffusion region spaced apart from the first photoelectric conversion layer and the second photoelectric conversion layer, a first transfer gate electrode between the first photoelectric conversion layer and the first common floating diffusion region, a second transfer gate electrode between the second photoelectric conversion layer and the first common floating diffusion region, and impurity regions of the second conductivity, the impurity regions in the semiconductor layer of the readout circuit region. The first photoelectric conversion layer and the second photoelectric conversion layer not being separated by an insulating layer.

DETAILED DESCRIPTION OF EMBODIMENTS

Hereinafter is discussed an image sensor according to some example embodiments of inventive concepts in conjunction with the accompanying drawings.

Figure 1:
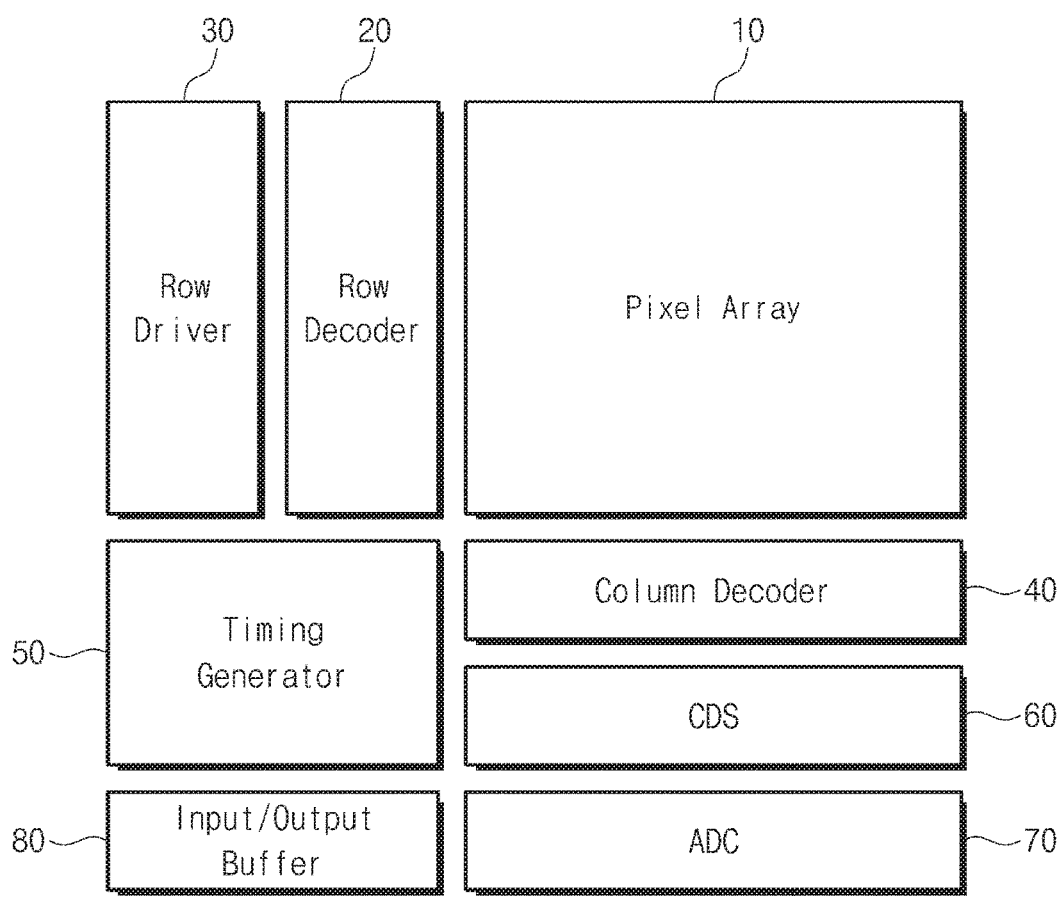
FIG. 1 is a block diagram illustrating an image sensor according to some example embodiments of inventive concepts.

FIG. 1 is a block diagram illustrating an image sensor according to some example embodiments of inventive concepts.

Referring to FIG. 1, an image sensor may include a pixel array 10, a row decoder 20, a row driver 30, a column decoder 40, a timing generator 50, a correlated double sampler (CDS) 60, an analog-to-digital converter (ADC) 70, and an input/output (I/O) buffer 80.

The pixel array 10 may include a plurality of unit pixels arranged along rows and columns, and may convert electromagnetic energy, e.g. light, incident on the unit pixels into an electrical signal. The pixel array 10 may be driven by a plurality of driving signals, for example a pixel select signal, a reset signal, and/or a charge transfer signal from the row decoder 20.

The row decoder 20 may provide several driving signals to each row of the unit pixels. The correlated double sampler 60 may be provided with electrical signals converted in the pixel array 10 in response to the driving signals.

The row driver 30 may provide the pixel array 10 with several driving signals for driving several unit pixels in response a decoded result obtained from the row decoder 20. For example, in case that the unit pixels are arranged in a matrix shape, the driving signals may be provided to each row.

The timing generator 50 may control the row and column decoders 20 and 40, the correlated double sampler 60, the analog-to-digital converter 70, and/or the input/output buffer 80, which are supplied by the timing generator 50 with control signals. The control signals may include a clock signal, a timing control signal, and/or other signals. The timing generator 50 may include a logic control circuit, a phase lock loop (PLL) circuit, a timing control circuit, a communication interface circuit, and/or other circuits.

The correlated double sampler 60 may receive the electrical signals generated in the pixel array 10, and may hold and sample the received electrical signals. The correlated double sampler 60 may perform a double sampling operation to sample a specific noise level and a signal level of the electrical signal, and then output a difference level corresponding to a difference between the noise and signal levels.

The analog-to-digital converter (ADC) 70 may convert analog signals, corresponding to the difference level received from the correlated double sampler 60, into digital signals, and then may output the converted digital signals.

The input/output buffer 80 may latch the digital signals and then sequentially output the latched digital signals to an image signal processing unit (not shown) in response to the decoded result obtained from the column decoder 40.

Figure 2:
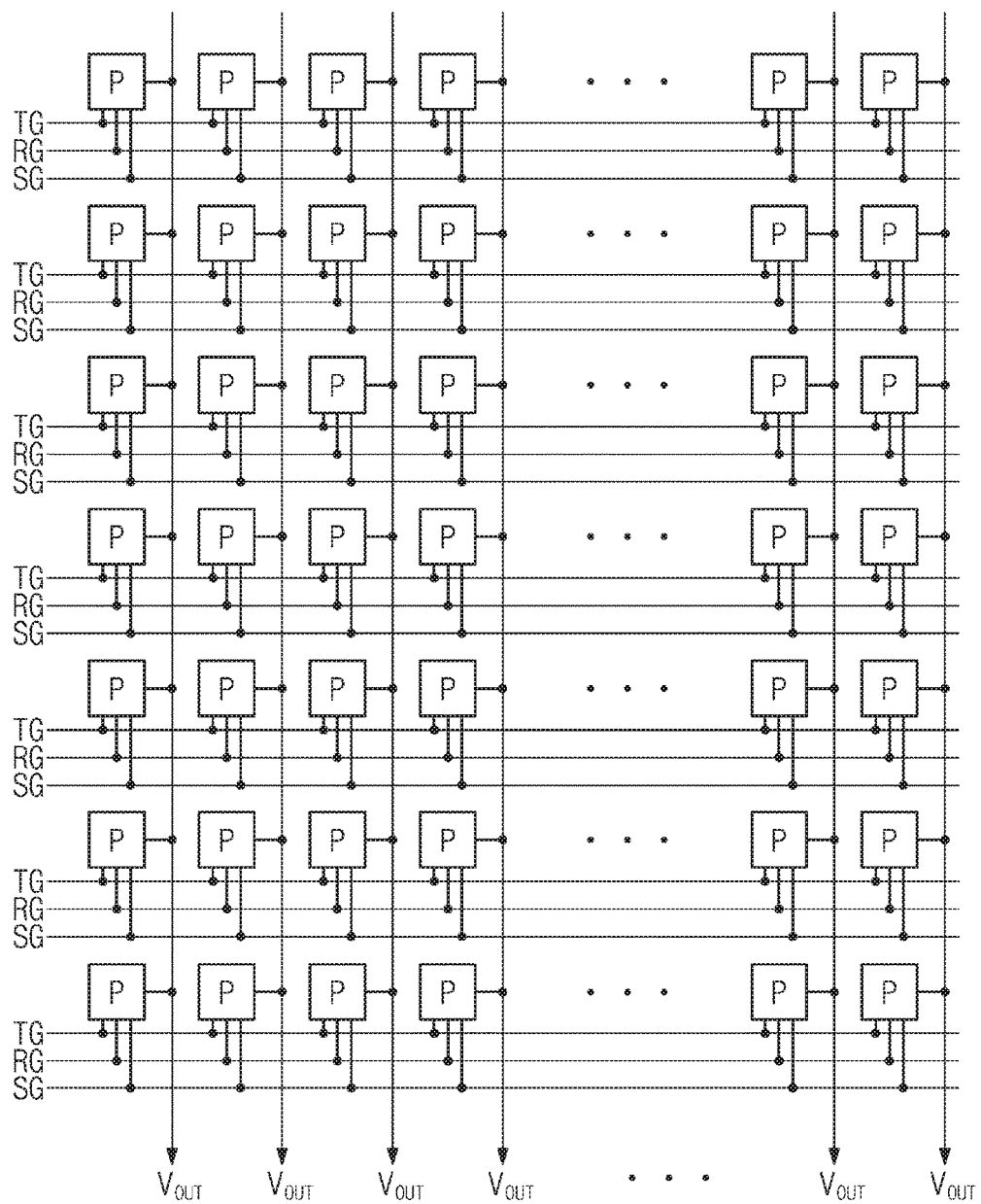
FIG. 2 is a block diagram illustrating a pixel array of an image sensor according to some example embodiments of inventive concepts.

FIG. 2 is a block diagram illustrating a pixel array of an image sensor according to some example embodiments of inventive concepts.

Referring to FIG. 2, the pixel array 10 may include a plurality of unit pixels P two-dimensionally arranged along a plurality of rows and columns.

An incident light may be converted into electrical signals in each of, or at least some of, the unit pixels P. A charge transfer signal TG, a reset signal RG, and a pixel select signal SG transmitted through driving signal lines may drive the unit pixels P. The correlated double sampler (see 60 of FIG. 1) may be provided through a plurality of output lines $V_{OUT}$ with the electrical signals converted in the unit pixels P.

Figure 3:
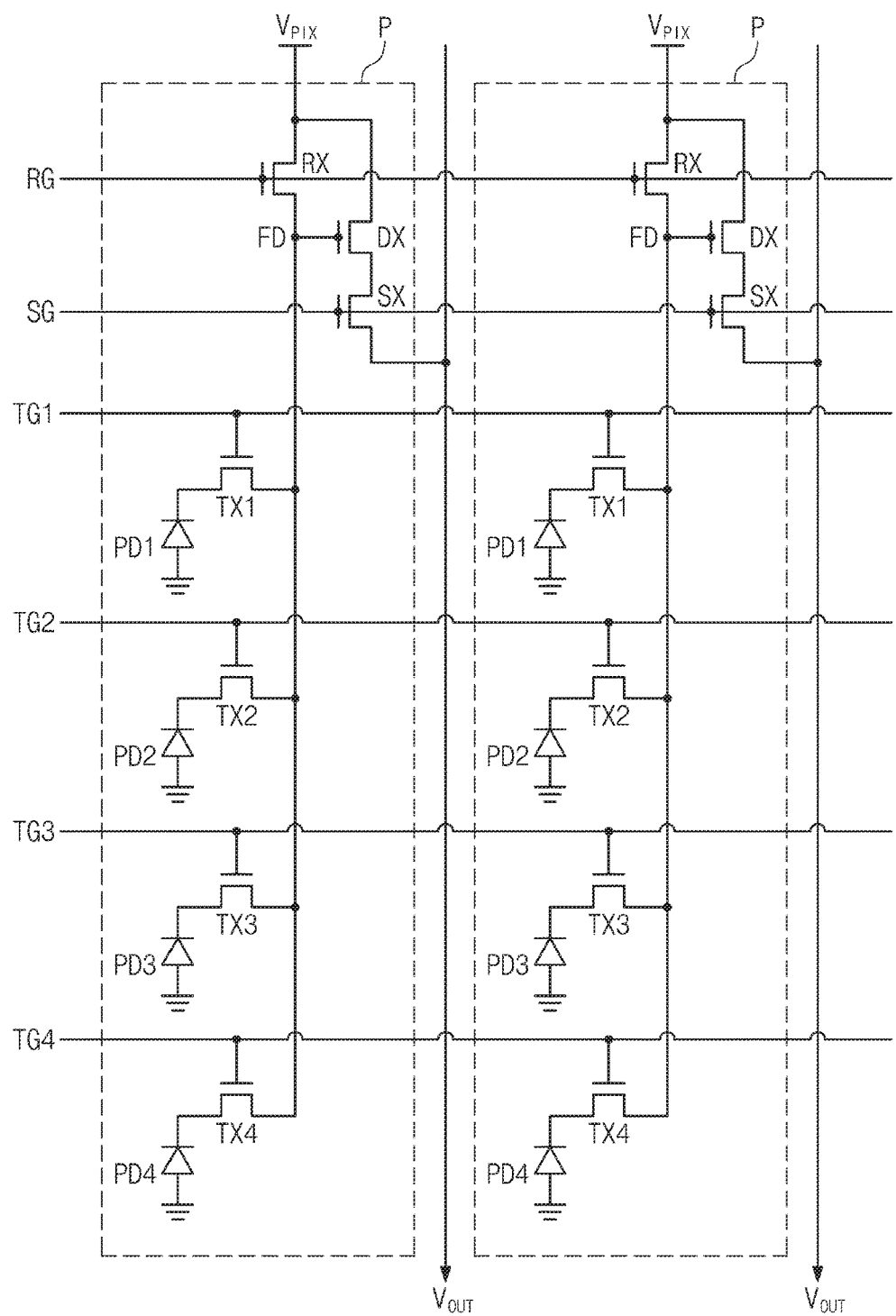
FIG. 3 is a circuit diagram illustrating a pixel array of an image sensor according to some example embodiments of inventive concepts.

FIG. 3 is a circuit diagram illustrating a pixel array of an image sensor according to some example embodiments of inventive concepts.

Referring to FIG. 3, the pixel array 10 may include plurality of the unit pixels P, which may be arranged along rows and columns.

Each of, or at least some of, the unit pixels P may include four photoelectric conversion devices PD1, PD2, PD3, and PD4 and four transfer transistors TX1, TX2, TX3, and TX4, The four transfer transistors TX1 to TX4 may share a charge detection node FD and a readout circuit. The readout circuit may include a reset transistor RX, a select transistor SX, and a drive transistor DX (e.g. a source follower transistor). Each of the unit pixels P is exemplarily illustrated to include four photoelectric devices and four transfer transistors, but inventive concepts are not limited thereto. For example, each of the unit pixels P may include two photoelectric devices and two transfer transistors.

The first to fourth photoelectric conversion devices PD1 to PD4 may generate and accumulate photo-charges in proportion to an amount of an external incident light. The first to fourth photoelectric conversion devices PD1 to PD4 may be or may include one of a photodiode, a phototransistor, a photogate, a pinned photodiode (PPD), and any combination thereof.

The first to fourth transfer transistors TX1 to TX4 may transfer the charges accumulated in the first to fourth photoelectric conversion devices PD1 to PD4 to the charge detection node (i.e., a floating diffusion region). First to fourth charge transfer signals TG1, TG2 TG3, and TG4 may control the first to fourth transfer transistors TX1 to TX4. Charges may be transferred to the charge detection node FD from any one of the first to fourth photoelectric devices PD1 to PD4 in accordance with and/or in response to the first to fourth charge transfer signals TG1, TG2, TG3, and TG4 applied to the first to fourth transfer transistors TX1 to TX4.

The charge detection node FD may receive to accumulate stored charges generated from the first to fourth photoelectric conversion devices PD1 to PD4. An amount of the photo-charges accumulated in the charge detection node FD may control the source follower transistor DX.

The reset transistor RX may periodically reset the charges accumulated in the charge detection node FD. In detail, the reset transistor RX may have a drain electrode connected to the charge detection node FD and a source electrode connected to a pixel power voltage $V_{PIX}$. When or if the reset transistor RX is turned on, the charge detection node FD may receive the pixel power voltage $V_{PIX}$ connected to the source electrode of the reset transistor RX. Accordingly, when or if the reset transistor RX is turned on, the charges accumulated in the charge detection node ID may be drained and then the charge detection node FD may be reset.

The source follower transistor DX may be or may include a source follower buffer amplifier that is configured to generate a source-drain current in proportion to an amount of photo-charges applied to a gate electrode. The source follower transistor DX may amplify a variation in electrical potential of the charge detection node FD, and may output the amplified signal through the select transistor SX. The source follower transistor DX may have a source electrode connected to the pixel power voltage $V_{PIX}$ and a drain electrode connected to a source electrode of the select transistor SX.

The select transistor SX may select each row of the unit pixels P to be read. When or if the select transistor SX is turned on, the output line $V_{OUT}$ may output an electrical signal output from the drain electrode of the source follower transistor DX.

Figure 4:
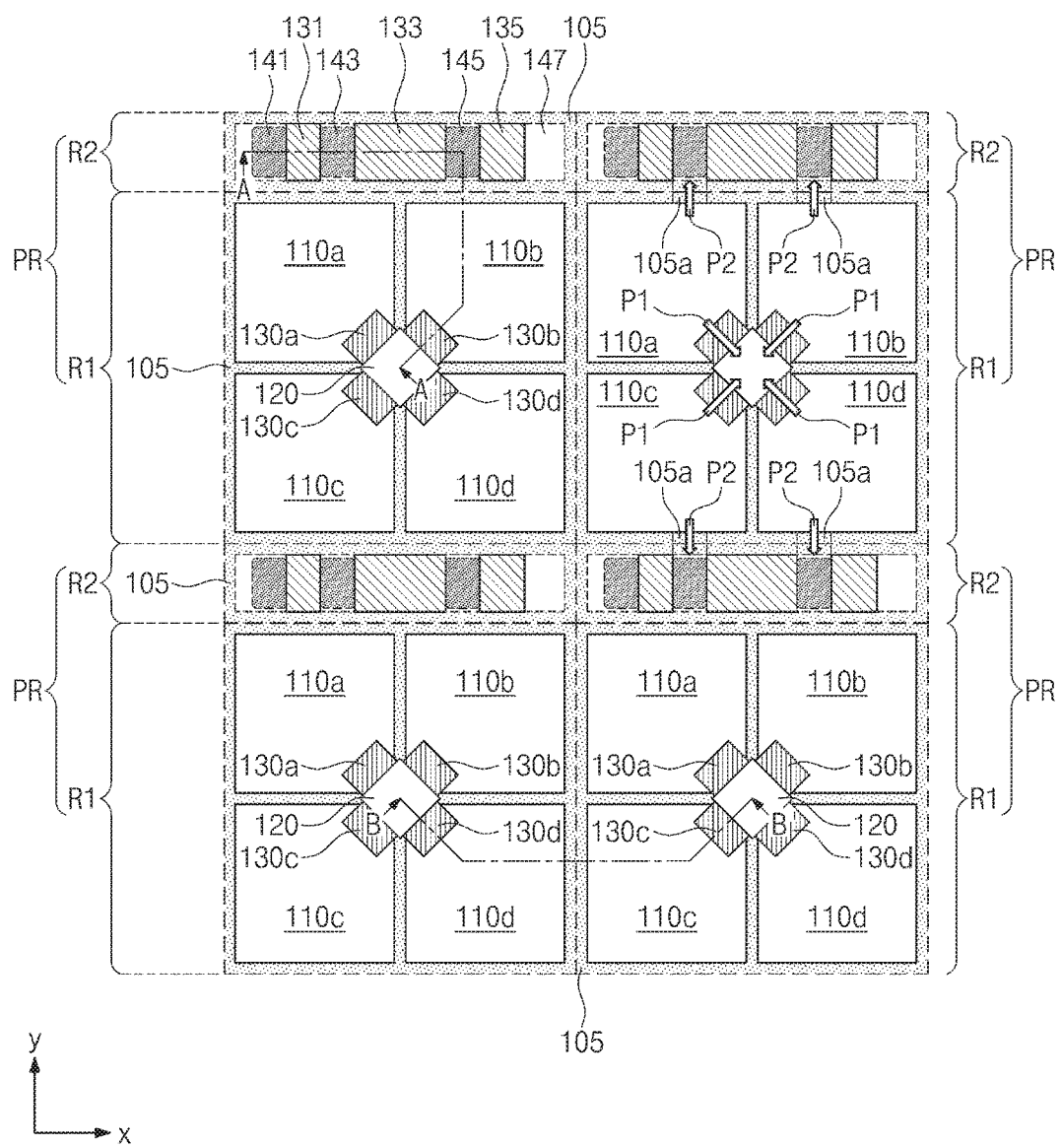
FIG. 4 is a simplified plan view of an image sensor according to some example embodiments of inventive concepts.
Figure 5A:
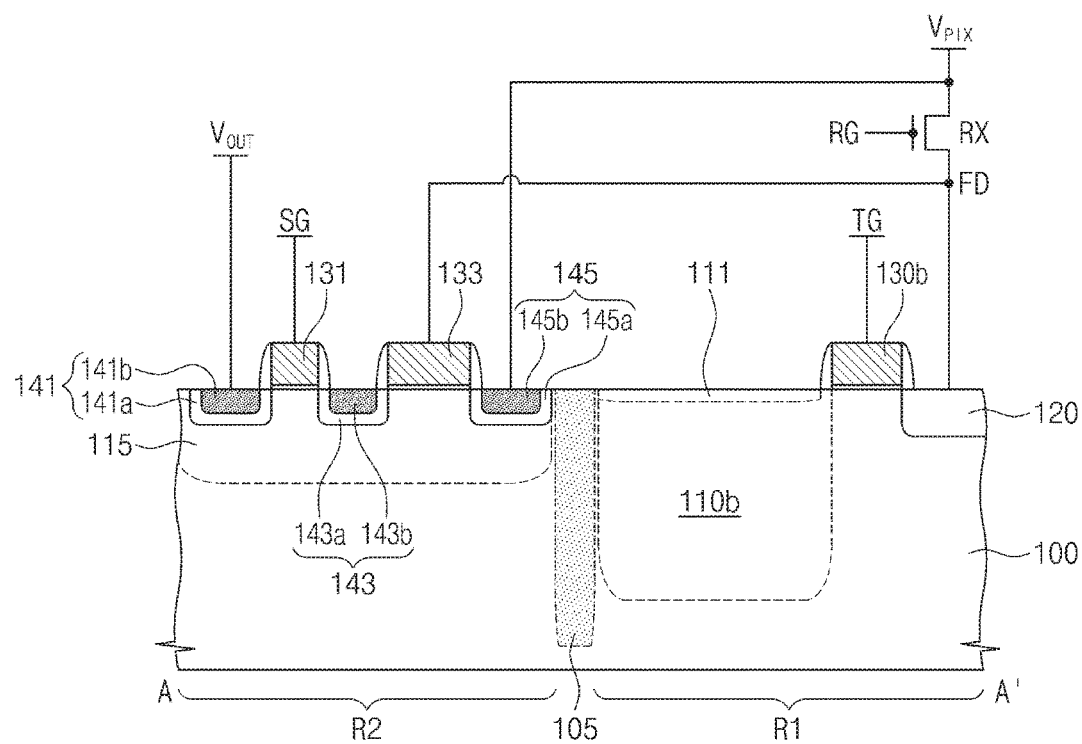
FIG. 5A is a cross-sectional view taken along line A-A' of FIG. 4.
Figure 5B:
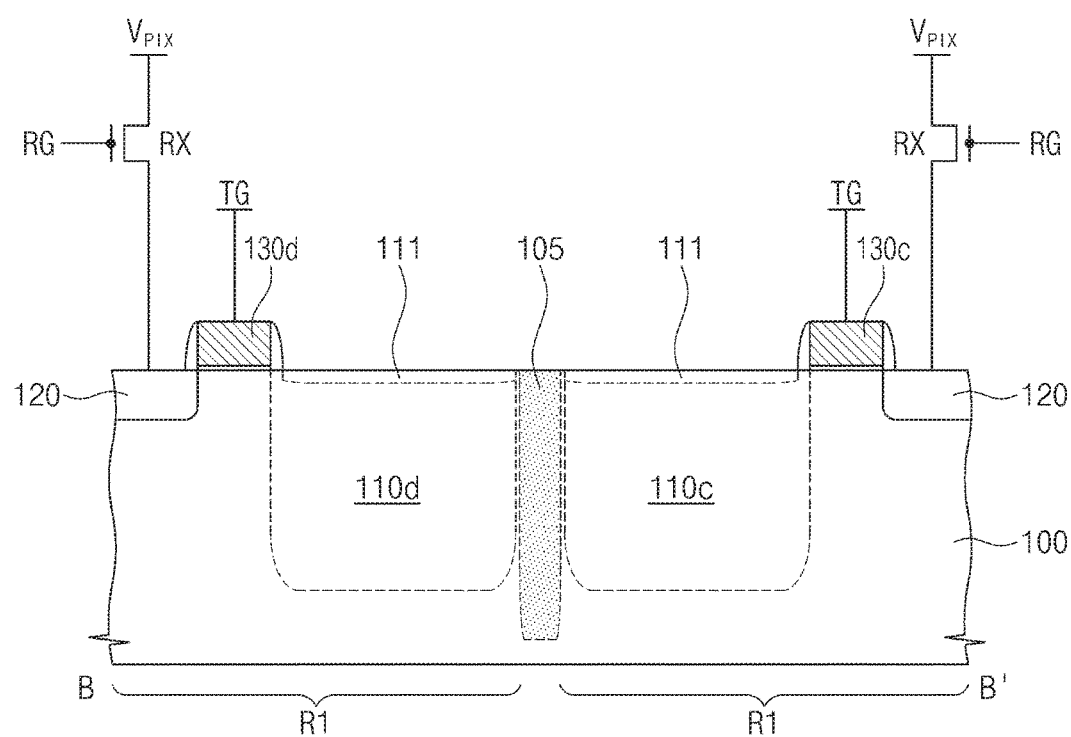
FIG. 5B is a cross-sectional view taken along line B-B' of FIG. 4.

FIG. 4 is a simplified plan view of an image sensor according to some example embodiments of inventive concepts. FIG. 5A shows a cross-sectional view taken along line A-A' of FIG. 4, and FIG. 5B shows a cross-sectional view taken along line B-B' of FIG. 4. FIG. 4 shows arrows P1 and P2 each indicating a charge path through which overflowing photo-charges are drained in response to photoelectric conversion layers being integrated with photo-charges, and this will be described in detail with reference to FIGS. 6, 7A, and 7B.

Referring to FIGS. 4, 5A, and 5B, a semiconductor layer 100 of a first conductivity (e.g., p-type) may be provided to include a plurality of pixel regions PR. In some example embodiments, the semiconductor layer 100 of the first conductivity may be a silicon epitaxial layer doped with p-type impurities. The p-type impurities may include, for example, boron.

As viewed in plan, the pixel regions PR may be arranged in a matrix shape along x- and y-directions. Each of the pixel regions PR may include a photoelectric conversion region R1 and a readout circuit region R2 defined by a separation impurity layer 105. The photoelectric conversion regions R1 of the pixel regions PR may be adjacent to each other in the x-direction, and the readout circuit regions R2 of the pixel regions PR may be adjacent to the photoelectric conversion regions R1 in the y-direction. The x-direction and the y-direction may cross each other. For example, the x-direction and the y-direction may be perpendicular to each other. There may not be an insulating layer separating the photoelectric conversion regions R1. For example, there may not be an insulating layer including silicon dioxide ($SiO_2$) separating the photoelectric conversion regions R1.

The separation impurity layer 105 may be formed by implanting the semiconductor layer 100 with first conductivity impurities (e.g., p-type impurities). The separation impurity layer 105 may have a p-type impurity concentration greater than that of the semiconductor layer 100.

The separation impurity layer 105 may include first segments extending in the x-direction and second segments extending in the v-direction, and the first and second segments may be arranged in a grid shape on the photoelectric conversion regions R1. The x-direction and the y-direction may cross each other. For example, the x-direction and the y-direction may be perpendicular to each other. There may not be an insulating layer separating the photoelectric conversion regions R1 and the readout circuit region R2. For example, there may not be an insulating layer including silicon dioxide ($SiO_2$) separating the photoelectric conversions regions R1 and the readout circuit R2.

The first segments of the separation impurity layer 105 may be between the photoelectric conversion region R1 and the readout circuit region R2, and the second segments of the separation impurity layer 105 may be between photoelectric conversion layers 110a to 110d adjacent to each other in the x-direction. The first and second segments of the separation impurity layer 105 may have substantially the same concentration of first conductivity impurities.

In some example embodiments, first to fourth photoelectric conversion layers 110a, 110b, 110c, and 110d may be provided in the semiconductor layer 100 of the photoelectric conversion region R1. As viewed in plan, the first to fourth photoelectric conversion layers 110a to 110d may be arranged in a matrix shape along the x- and y-directions. The x-direction and the y-direction may cross each other. For example, the x-direction and the y-direction may be perpendicular to each other.

The first to fourth photoelectric conversion layers 110a to 110d may be formed implanting the semiconductor layer 100 with second conductivity (e.g., n-type) impurities. The second conductivity impurities may include phosphorus or arsenic. Photodiodes may be created by a junction between the semiconductor layer 100 having the first conductivity and the first to fourth photoelectric conversion layers 110a to 110d each having the second conductivity.

On each of the photoelectric conversion regions R1, the first to fourth photoelectric conversion layers 110a to 110d may be separated from each other by the separation impurity layer 105. The separation impurity layer 105 may surround each of the first to fourth photoelectric conversion layers 110a to 110d. For example, the separation impurity layer 105 may be between the first and second photoelectric conversion layers 110a and 110b adjacent to each other in the x-direction and between the third and fourth photoelectric conversion layers 110c and 110d adjacent to each other in the x-direction. Furthermore, the separation impurity layer 105 may be between the first and third photoelectric conversion layers 110a and 110c adjacent to each other in the y-direction and between the second and fourth photoelectric conversion layers 110b and 110d adjacent to each other in the y-direction. The x-direction and the y-direction may cross each other. For example, the x-direction and the y-direction may be perpendicular to each other. There may not be an insulating layer separating the photoelectric conversion layers 110a-110d. For example, there may not be an insulating layer including silicon dioxide ($SiO_2$) separating the photoelectric conversion layer 110a from the photoelectric conversion layer 110b.

The separation impurity layer 105 whose conductivity is opposite to those of the first to fourth photoelectric conversion layers 110a to 110d may provide a potential barrier between the first to fourth photoelectric conversion layers 110a to 110d. For example, the first to fourth photoelectric conversion layers 110a to 110d may each have a potential well formed by the separation impurity layer 105.

In some example embodiments, as the first to fourth photoelectric conversion layers 110a to 110d are separated from each other by the separation impurity layer 105, the first to fourth photoelectric conversion layers 110a to 110d may be provided therebetween without an insulating layer including insulating material whose refractive index is different from that of the semiconductor layer 100, for example silicon dioxide (SiO$_2$). Thus reducing refraction and reflection of light may be possible. In addition, as the first to fourth photoelectric conversion layers 110a to 110d are separated from each other by the separation impurity layer 105 without a structure such as an insulation layer and/or a shallow trench isolation STI layer being formed in the semiconductor layer 100 so as to separate the first to fourth photoelectric layers 110a to 110d from each other, lattice defects (e.g., dangling bonds) may be prevented from, or reduced in likelihood of occurrence from, being generated between the first to fourth photoelectric conversion layers 110a to 110d.

Each of the first to fourth photoelectric conversion layers 110a to 110d may be provided thereon with a surface impurity layer 111, which has the first conductivity, for preventing dark current. The surface impurity layer 11 may be formed by lightly implanting first conductivity impurities into a surface of each of the first to fourth photoelectric conversion layers 110a to 110d. The concentration of the first conductivity impurities may be greater than that of the semiconductor layer 100.

On each of the pixel regions PR, a common floating diffusion region 120 may be on a center of the photoelectric conversion region R1. The common floating diffusion region 120 may be formed by implanting the semiconductor layer 100 with second conductivity impurities (e.g., n-type impurities).

The semiconductor layer 100 of the photoelectric conversion region R1 may be provided thereon with first to fourth transfer gate electrodes 130a, 130b, 130c, and 130d. The first to fourth transfer gate electrodes 130a to 130d may be between the common floating diffusion region 120 and, respectively, the first to fourth photoelectric conversion layers 110a to 110d. Gate dielectric layers may be interposed between the semiconductor layer 100 and the first to fourth transfer gate electrodes 130a to 130d.

The semiconductor layer 100 of the readout circuit region R2 may be provided therein with a well impurity layer 115 surrounded by the separation impurity layer 105. The well impurity layer 115 may be formed by implanting the semiconductor layer 110 with first conductivity impurities, whose concentration is less than that of the separation impurity layer 105. In some example embodiments, the separation impurity layer 105 may surround the well impurity layer 115 of the readout circuit region, R2 and may provide a potential barrier between the photoelectric conversion region R1 and the readout circuit region R2.

The well impurity layer 115 of the readout circuit region R2 may be provided thereon with a source follower transistor (see DX of FIG. 3), a reset transistor (see RX of FIG. 3), and a select transistor (see SX of FIG. 3). In another example embodiment, no well impurity layer 115 may be provided, and accordingly the semiconductor layer 100 may be provided thereon with the source follower transistor (see DX of FIG. 3), the reset transistor (see RX of FIG. 3), and the select transistor (see SX of FIG. 3).

For example, the well impurity layer 115 may be provided thereon with a select gate electrode 131, a source follower gate electrode 133, and a reset gate electrode 135 that are spaced apart from each other. A gate dielectric layer may be interposed between the well impurity layer 115 and each of the select gate electrode 131, the source follower gate electrode 133, and the reset gate electrode 135. On each of, or at least some of, the pixel regions PR, the source follower gate electrode 133 may be between the select gate electrode 131 and the reset gate electrode 135. The source follower gate electrode 133 may have an x-directional length (e.g. a gate length) greater than that of the select gate electrode 131 and/or greater than that of the reset gate electrode 135.

A first source/drain region 141 may be in the well impurity layer 115 on a side of the select gate electrode 131, and a second source/drain region 143 may be in the well impurity layer 115 on a side of the source follower gate electrode 133. A third source/drain region 145 may be in the well impurity layer 115 on a side of the reset gate electrode 135. A fourth source/drain region 147 may be in the well impurity layer 115 on an opposite side of the reset gate electrode 135.

The first to fourth source/drain regions 141, 143, 145, and 147 may be formed by implanting the well impurity layer 115 with second conductivity impurities (e.g., n-type impurities). In some example embodiments, the first to third source/drain regions 141, 143, and 145 may include first to third lightly doped impurity regions 141a, 143a, and 145a, respectively, and first to third heavily doped impurity regions 141b, 143b, and 145b, respectively, while the fourth source/drain region 147 may consist of a lightly doped impurity region. In some example embodiments, each of the first to third source/drain regions 141, 143, and 145 may have a second-conductivity impurity concentration greater than that of each of the first to fourth photoelectric conversion layers 110a to 110d.

The first to fourth source/drain regions 141, 143, 145, and 147 may be adjacent to the separation impurity layer 105, and accordingly may lead to an increase in potential level at partial sections 105a of the separation impurity layer 105 that are adjacent to the first to fourth source/drain regions 141, 143, 145, and 147.

Each of the first to fourth source/drain regions 141, 143, 145, and 147 may have a y-directional width, and thus a reduced distance may be provided between the separation impurity layer 105 and each of the first to fourth source/drain regions 141, 143, 145, and 147. The shorter the distance between the separation impurity layer 105 and each of the first to fourth source/drain regions 141, 143, 145, and 147, the higher the potential level at the partial sections 105a of the separation impurity layer 105. For example, the separation impurity layer 105 may have a low potential barrier at the partial sections 105a adjacent to the first to fourth source/drain regions 141, 143, 145, and 147.

In some example embodiments, the first source/drain region 141 may be electrically connected to an output line $V_{OUT}$, and the second source/drain region 143 may be a drain electrode of a source follower transistor (see DX of FIG. 3) having the source follower gate electrode 133. A pixel power voltage $V_{PIX}$ may be electrically connected to the third source/drain region 145 between the source follower gate electrode 133 and the reset gate electrode 135. The common floating diffusion region 120 may be electrically connected through a conductive line (not shown) to the fourth source/drain region 147 together with the source follower gate electrode 133.

Figure 6:
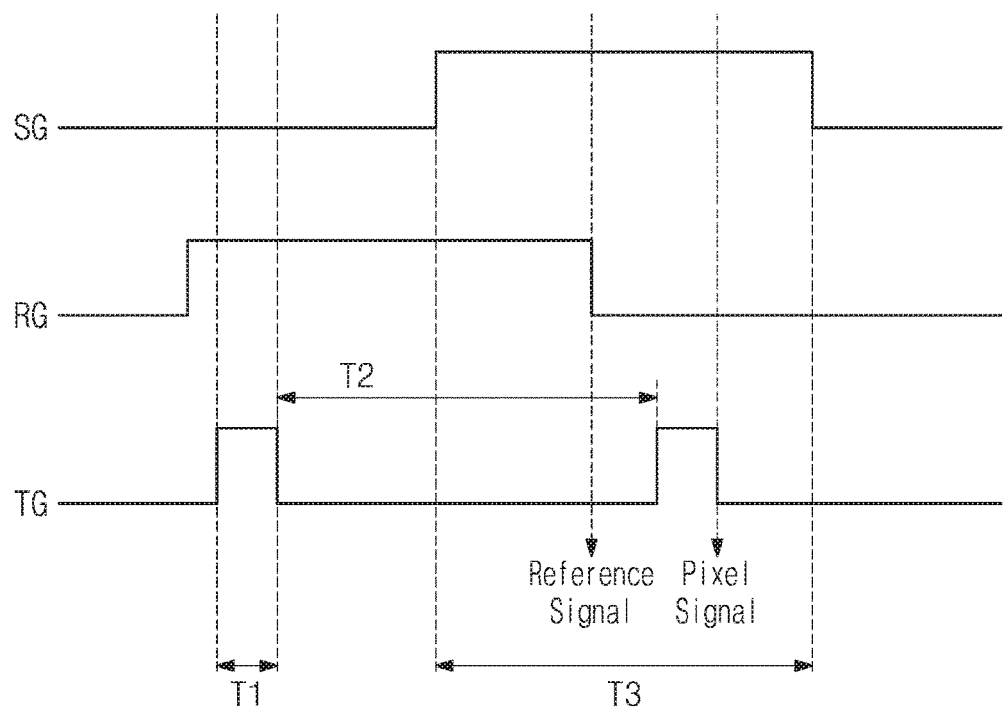
FIG. 6 is a timing diagram for explaining operation of unit pixels of an image sensor according to some example embodiments of inventive concepts.

FIG. 6 is a timing diagram for explaining operation of unit pixels of an image sensor according to some example embodiments of inventive concepts.

Referring to FIG. 6, unit pixels of an image sensor may operate in the following sequence: a reset mode T1 to reset photoelectric conversion layers and a floating diffusion region (or a charge detection node); an optical integration mode T2 to accumulate photo-charges in the photoelectric conversion layers; and a readout mode T3 to output the accumulated photo-charges as electrical signals.

For example, referring to FIGS. 3 and 6, in the operation of the reset mode T1, a reset signal RG and a charge transfer signal TG may be activated to turn on the reset transistor RX and the transfer transistors TX1 to TX4. Accordingly, the photoelectric conversion layers and the floating diffusion region may be reset (or initialized) due to exhaustion of their charges.

After the reset mode T1 is done, the optical integration mode T2 may be operated. In the operation of the optical integration mode T2, the photoelectric conversion layers may generate and accumulate photo-charges originating from an incident light during a period (e.g., a photoelectric conversion time) in which the transfer transistors TX1 to TX4 are turned off and then turned on again.

In the operation of the readout mode T3 a select signal SG may be activated to turn on the select transistor SX so that selected unit pixels may start read operation of photo-charges. After the select signal SG is activated, the reset signal RG may be inactivated to turn off the reset transistor RX so that the reset of the floating diffusion region may be terminated. Accordingly, a reference signal may be output from detection of a reset potential in the floating diffusion region.

After the reference signal is output, the transfer signal TG may be activated and the floating diffusion region may be transmitted with the photo-charges accumulated in the photoelectric conversion layers. After the charge transfer signal TG is inactivated, a pixel signal may be output from detection of a potential in the floating diffusion region accumulated with the charges transmitted from the photoelectric conversion layers.

A signal processing unit may receive the reference and pixel signals that are output in the operation of the readout mode T3, and then may use a difference in the reference and pixel signals to output an image data of each unit pixel.

Figure 7A:
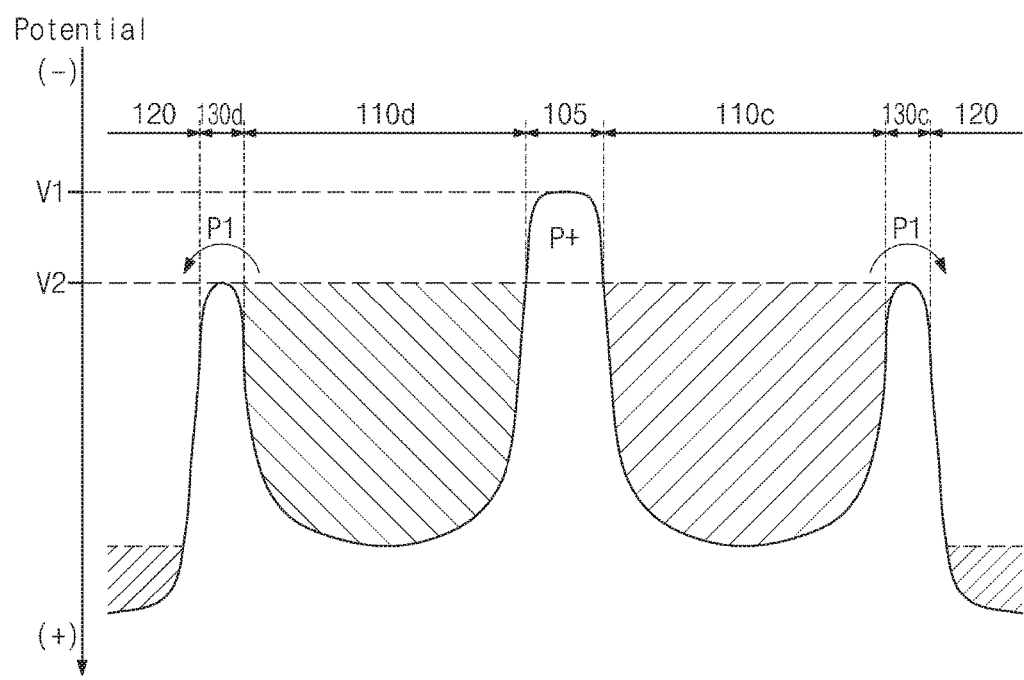
FIGS. 7A and 7B are potential diagrams of an image sensor according to some example embodiments of inventive concepts.
Figure 7B:
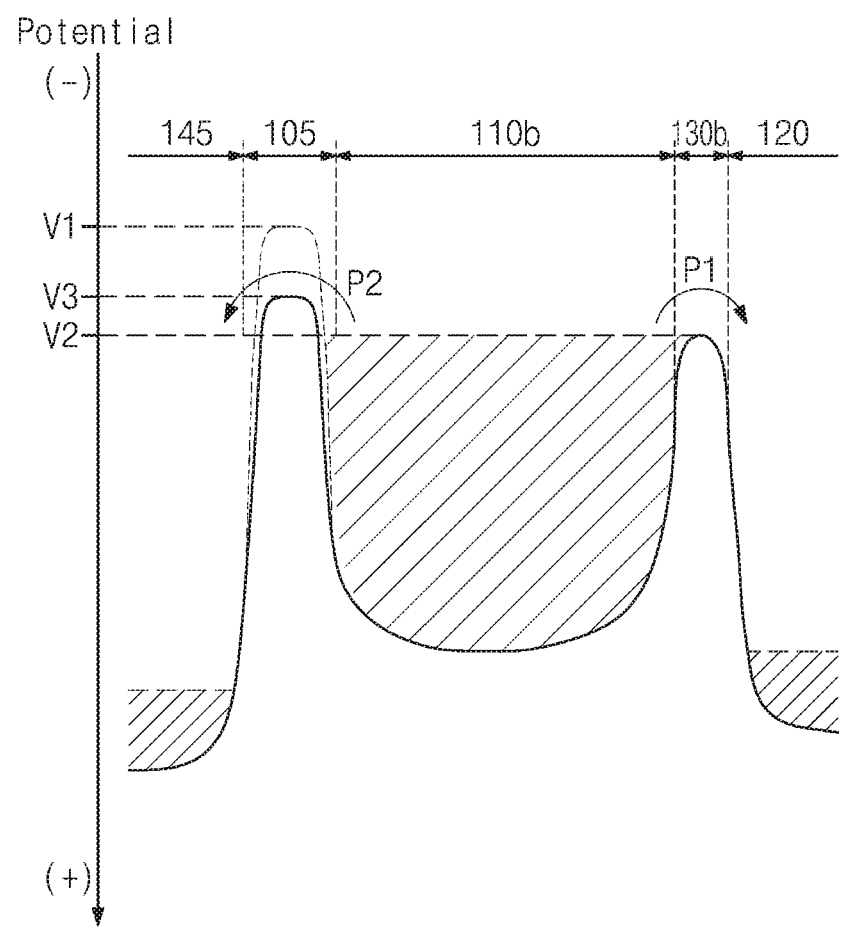

FIGS. 7A and 7B are potential diagrams of an image sensor according to some example embodiments of inventive concepts. FIGS. 7A and 7B each show a potential level of an image sensor under the optical integration mode in which photo-charges are integrated in the photoelectric conversion layers.

Referring to FIGS. 7A and 7B, when an image sensor is operated, the separation impurity layer 105 and the photoelectric conversion layers 110a to 110d photodiodes) may be provided therebetween with a first potential barrier due to a difference in potential level between the separation impurity layer 105 and the photoelectric conversion layers 110a to 110d.

In the optical integration mode T2, the heavily p-doped separation impurity layer 105 may have a first potential level V1. As the charge transfer signal TG is inactivated to turn off the transfer transistors TX1 to TX4 in the optical integration mode 12, a second potential level V2 may be provided to channel regions under the transfer gate electrodes 130a. The second potential level V2 may be greater than the first potential level V1. The common floating diffusion region 120 and the photoelectric conversion layers 110a to 110d may be provided therebetween with a second potential barrier due to a difference in potential level between the photoelectric conversion layers 110a to 110d and the transfer gate electrodes 130a, The second potential barrier may be less than the first potential barrier. These potential barriers may create potential wells in the photoelectric conversion layers 110a to 110d, which may accumulate therein photo-charges originating from an incident light during the optical integration mode T2.

In some example embodiments, a heavily doped n-type impurity region may cause to reduce the potential level of the separation impurity layer 105 in an area adjacent to any one of the first to fourth source/drain regions 141, 143, 145, and 147 provided on the readout circuit region R2. Thus, in areas adjacent to the first to fourth source/drain regions 141, 143, 145, and 147, the separation impurity layer 105 may have a third potential level V3 greater than the first potential level V1 and less than the second potential level V2. For example, the first potential barrier may be locally reduced in portions of the separation impurity layer 105 that are adjacent to the first to fourth source/drain regions 141, 143, 145, and 147.

In some example embodiments, the Third potential level V3 of the separation impurity layer 105 may be changed based on applied voltages and n-type impurity doping concentrations in the first to fourth source/drain regions 141, 143, 145, and 147, In addition, the third potential level V3 of the separation impurity layer 105 may be changed depending on the y-directional widths of the first to fourth source/drain regions 141, 143, 145, and 147. For example, the third potential level V3 may decrease with an increase of the y-directional widths of the first to fourth source/drain regions 141, 143, 145, and 147. For example, the third potential level V3 may decrease as the first to fourth source/drain regions 141, 143, 145, and 147 approaches the separation impurity layer 105.

During the optical integration mode T2, when the photoelectric conversion layers 110a to 110d receive light of more than a reference luminous intensity, photo-charges may be generated to exceed full well capacity (FWC) of the photoelectric conversion layers 110a to 110d. Charges may then overflow from the photoelectric conversion layers 110a to 110d into the common floating diffusion region 120 after passing over the second potential barrier under the transfer gate electrodes 130a to 130d, so that the common floating diffusion region 120 may store the overflowing charges. Furthermore, the overflowing charges may pass over the first potential barrier adjacent to the first to fourth source/drain regions 141, 143, 145, and 147, and then may be stored in the first to fourth source/drain regions 141, 143, 145, and 147. Reset operations of unit pixels may drain the charges overflowing into the common floating diffusion region 120 and the first to fourth source/drain regions 141, 143, 145, and 147.

For example, when photo-charges are generated to exceed the full well capacity of a photodiode, as shown in FIG. 4, the overflowing charges may be drained through first charge paths P1 between the common floating diffusion region 120 and the photoelectric conversion layers 110a to 110d, and also through second charge paths P2 between the photoelectric conversion layers 110a to 110d and the first to fourth source/drain regions 141, 143, 145, and 147. Reducing the likelihood of a blooming phenomenon in which the overflowing charges move into the photoelectric conversion layers 110a to 110d after passing over the first potential barrier between the separation impurity layer 105 and the photoelectric conversion layers 110a to 110d may be possible.

Further, as the separation impurity layer 105 has the third potential level V3 at portions adjacent to the first to fourth source/drain regions 141, 143, 145, and 147, the reduction in the blooming phenomenon may also occur when photo-charges are accumulated in a photodiode. Accordingly, because there is no need to or desire to reduce a potential barrier under the transfer gate electrodes 130a to 130d (i.e., in the first charge paths P1) in order to improve the blooming phenomenon, the likelihood of securing the full well capacity of a photodiode may be possible.

Figure 8:
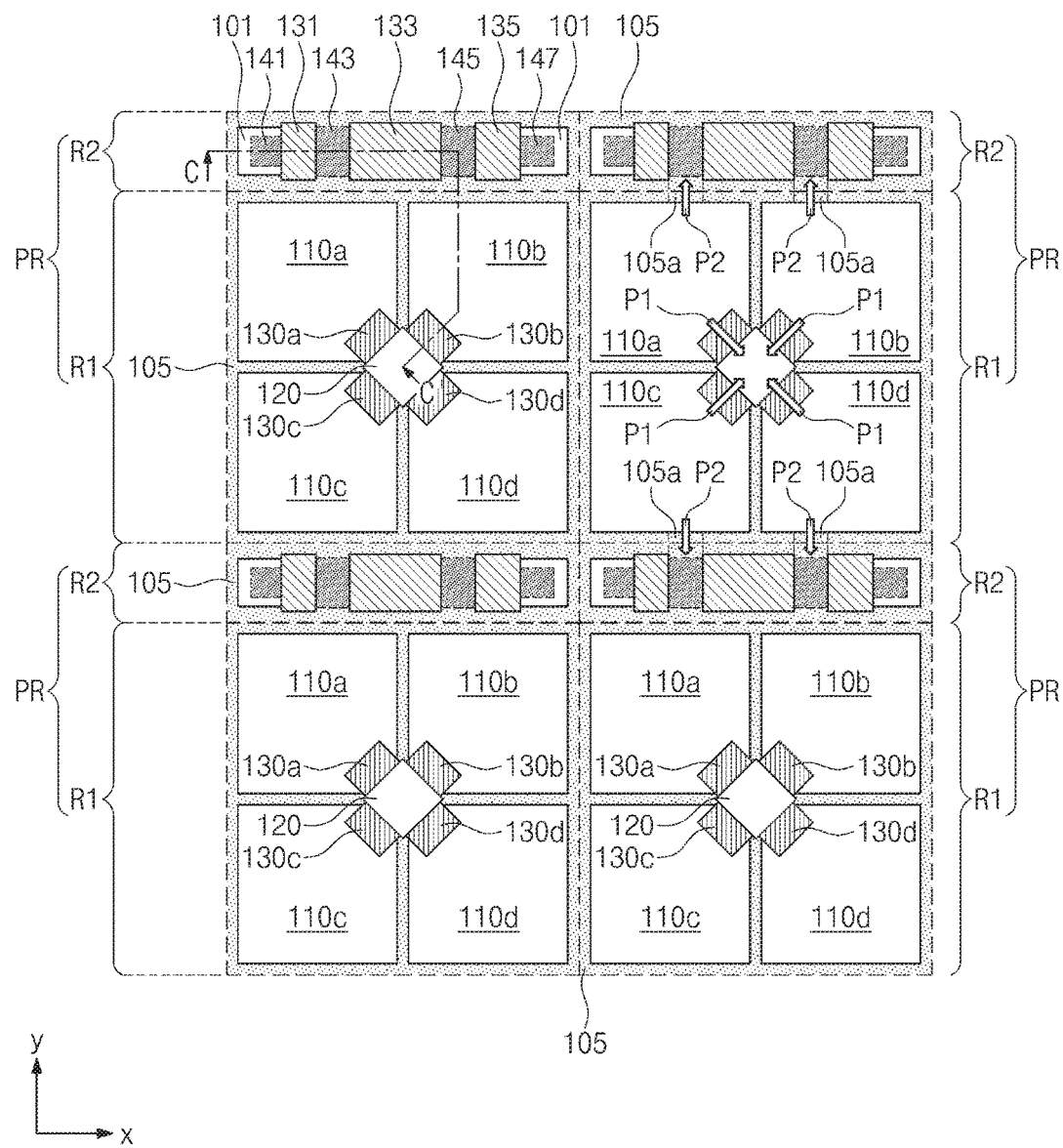
FIG. 8 is a simplified plan view of an image sensor according to some example embodiments of inventive concepts.
Figure 9:
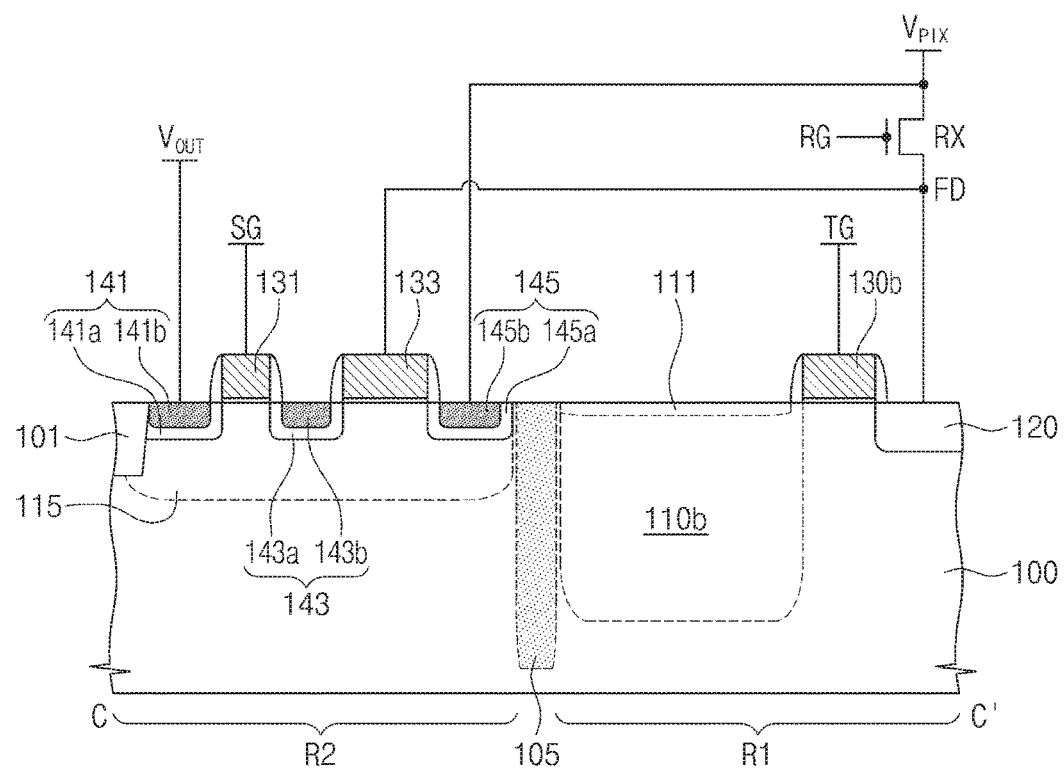
FIG. 9 is a cross-sectional view taken along line C-C' of FIG. 8.

FIG. 8 is a simplified plan view of an image sensor according to some example embodiments of inventive concepts. FIG. 9 is a cross-sectional view taken along line C-C' of FIG. 8. For brevity of the description, those components substantially the same as those of the aforementioned embodiments are allocated the same reference numerals thereto, and explanations thereof will be simplified or omitted.

Referring to FIG. 8, a device isolation layer 101 may be provided on the readout circuit region R2 of each pixel region PR. For example, the device isolation layer 101 may be between the readout circuit regions R2 adjacent to each other, and may surround the first and fourth source/drain regions 141 and 147. The device isolation layer may include an insulating material, such as silicon dioxide ($SiO_2$).

On the readout circuit region R2, the device isolation layer 101 may be locally on an area to be supplied with a high voltage such as the pixel power voltage $V_{PIX}$ and/or an area between p- and n-type impurity regions where a staircase junction is created, and therefore interference may be reduced between readout circuits of neighboring unit pixels.

The second and third source/drain regions 143 and 145 may be, as discussed above, adjacent to the separation impurity layer 105, and the potential level of the separation impurity layer 105 may be locally reduced depending on concentrations of the second conductivity impurities in the second and third source/drain regions 143 and 145.

Figure 10:
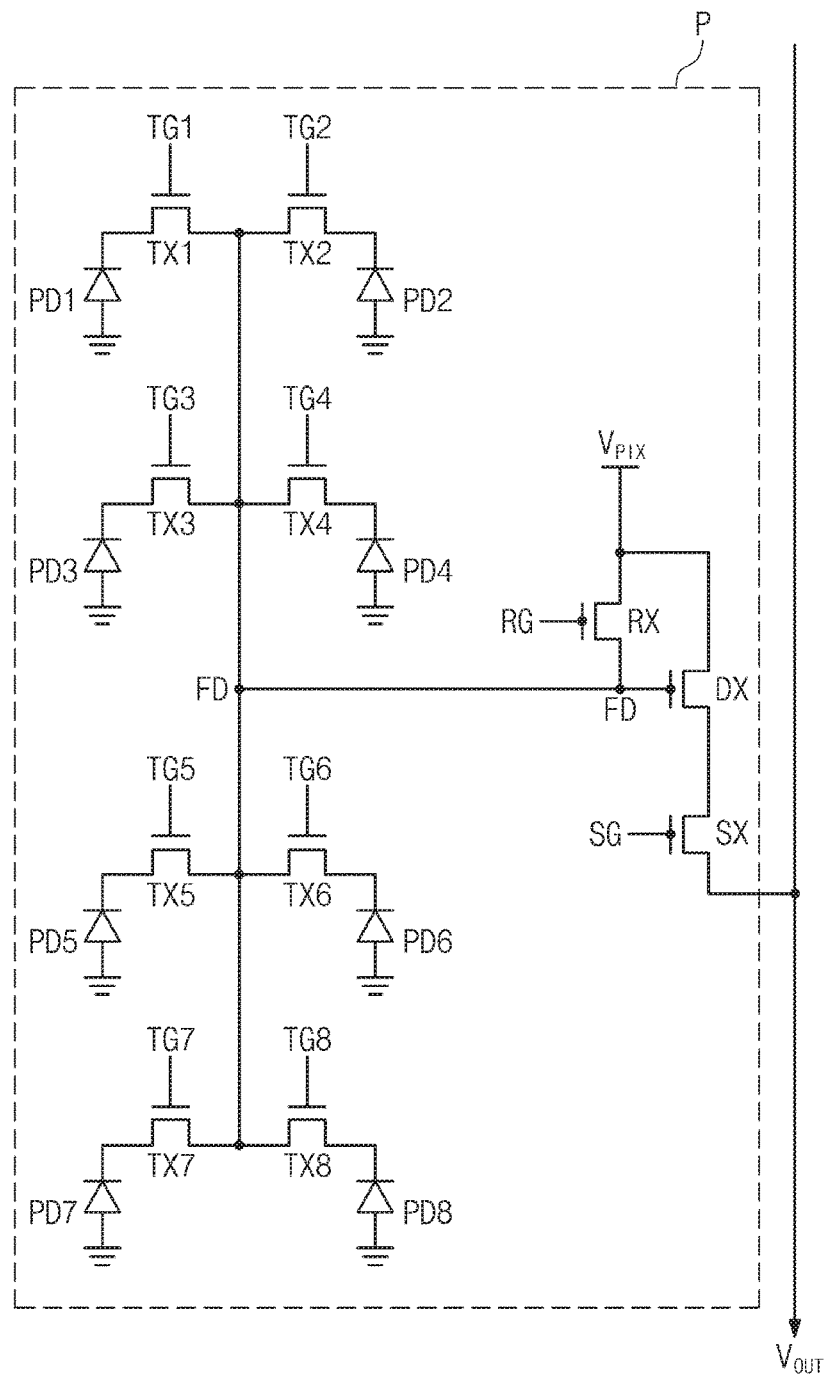
FIG. 10 is a circuit diagram illustrating a pixel array of an image sensor according to some example embodiments of inventive concepts.

FIG. 10 is a circuit diagram illustrating a pixel array of an image sensor according to some example embodiments of inventive concepts. For brevity of the description, those components substantially the same as those of the embodiments discussed with reference to FIG. 3 are allocated the same reference numerals thereto, and explanations thereof will be simplified or omitted.

Referring to FIG. 10, the unit pixel P may include eight photoelectric conversion devices PD1 to PD8 and eight transfer transistors TX1 to TX8. The eight transfer transistors TX1 to TX8 may share a readout circuit (e.g., the reset transistor RX, the source follower transistor DX, and the select transistor SX). For example, the transfer transistors TX1 to TX8 may be commonly connected to the charge detection node FD. First to eighth transfer transistors TX1 to TX8 may be controlled by first to eighth charge transfer signals TG1 to TG8, respectively.

Figure 11:
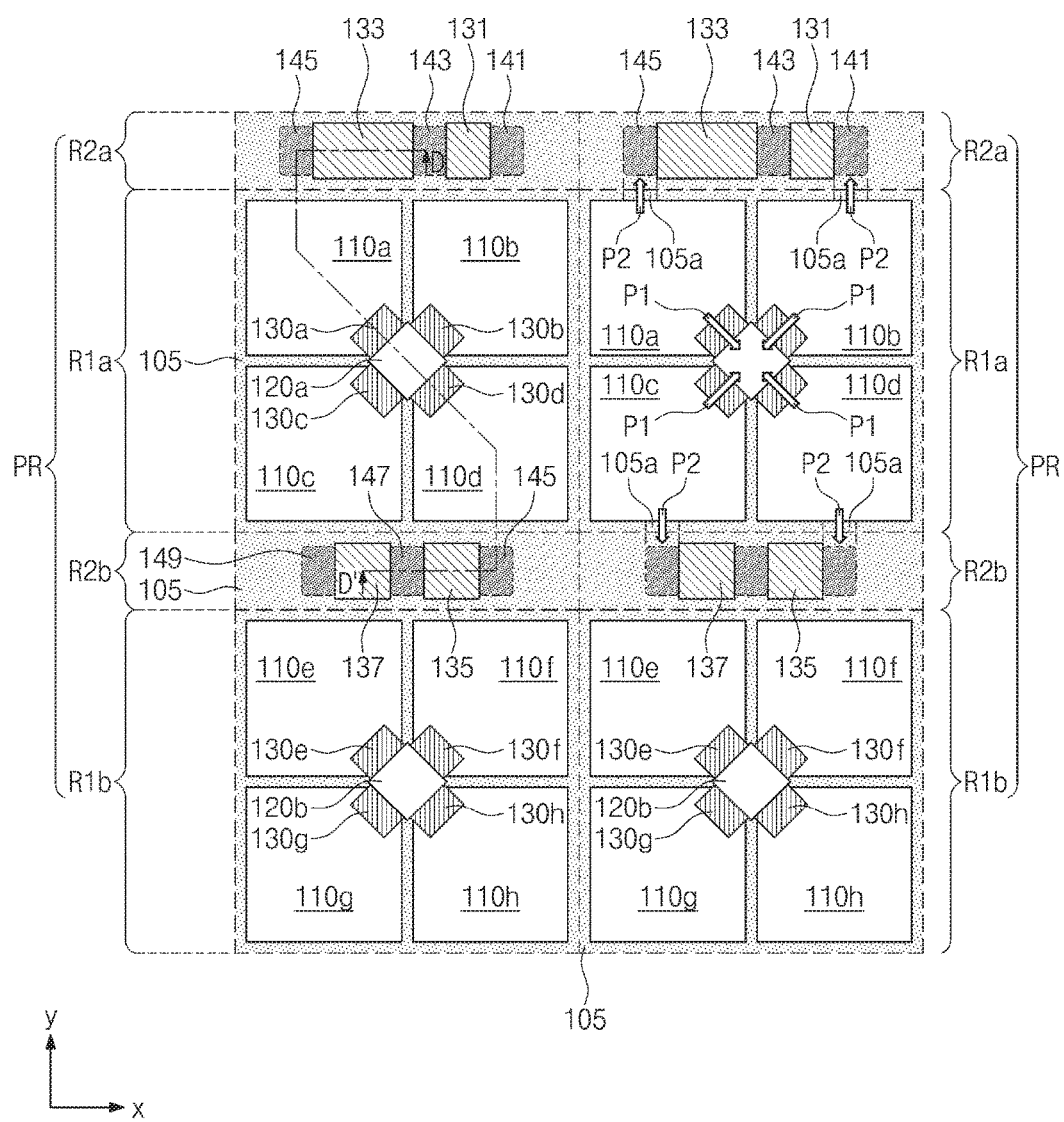
FIG. 11 is a simplified plan view of an image sensor according to some example embodiments of inventive concepts.
Figure 12:
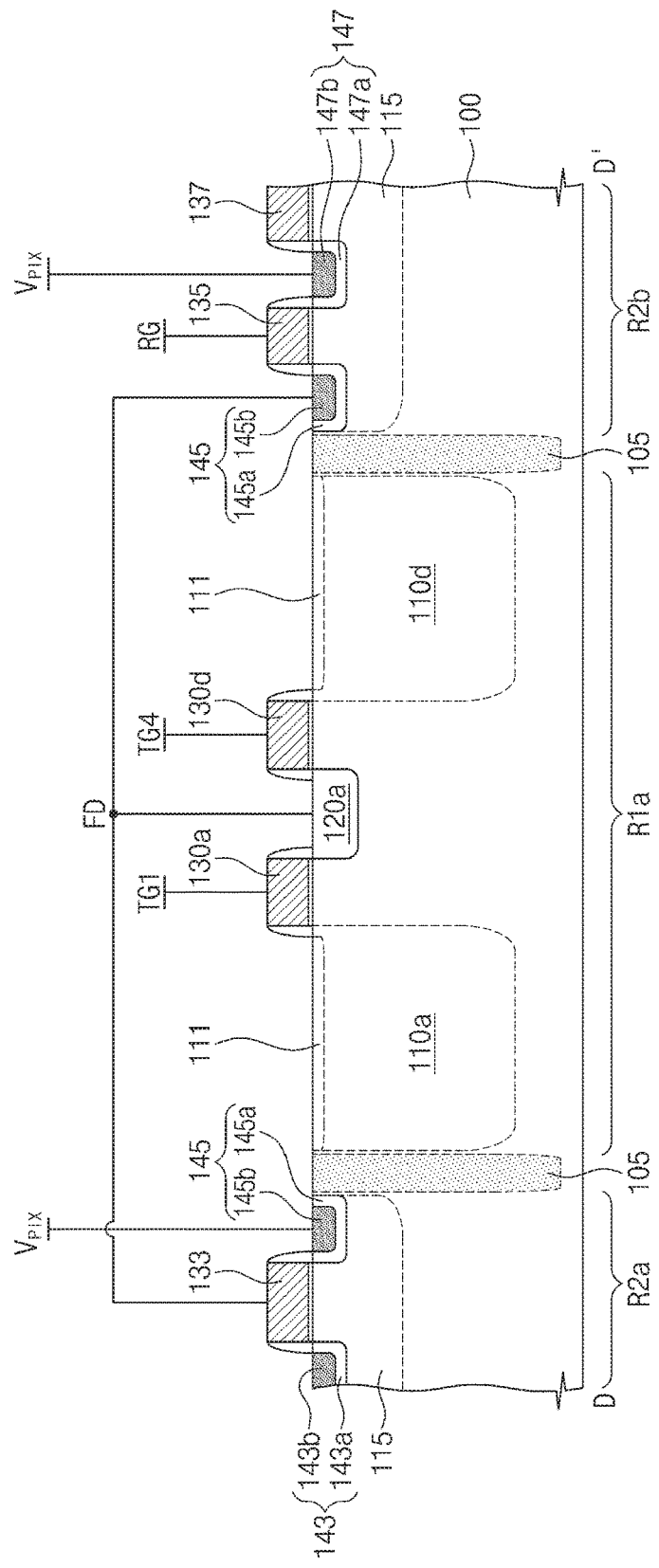
FIG. 12 is a cross-sectional view taken along line D-D' of FIG. 11.

FIG. 11 is a simplified plan view of an image sensor according to some example embodiments of inventive concepts. FIG. 12 is a cross-sectional view taken along line D-D' of FIG. 11. For brevity of the description, those components substantially the same as those of the embodiments discussed with reference to FIGS. 4, 5A, and 5B are allocated the same reference numerals thereto, and explanations thereof will be simplified or omitted.

Referring to FIGS. 11 and 12, each of the pixel regions PR may include first and second photoelectric conversion regions R1a and R1b that are defined by the separation impurity layer 105, and may further include first and second readout circuit regions R2a and R2b that are defined by the separation impurity layer 105. The first photoelectric conversion regions R1a may be adjacent to each other in the x-direction, and spaced apart from the second photoelectric conversion regions R1b in the y-direction across the second readout circuit regions R2b. The first readout circuit regions R2a may be spaced apart from each other in the y-direction across the first photoelectric conversion regions R1a.

First to fourth photoelectric conversion layers 110a to 110d may be in the semiconductor layer 100 of the first photoelectric conversion regions R1a, and fifth to eighth photoelectric conversion layers 110e to 110h may be in the semiconductor layer 100 of the second photoelectric conversion regions R1b. The separation impurity layer 105 may surround each of the first to eighth photoelectric conversion layers 110a to 110h.

A first common floating diffusion region 120a may be on a center of each of the first photoelectric conversion regions R1a, and a second common floating diffusion region 120b may be on a center of each of the second photoelectric conversion regions R1b.

First to fourth transfer gate electrodes 130a to 130d may be between the first common floating diffusion region 120a and the first to fourth photoelectric conversion layers 110a to 110d, and fifth to eighth transfer gate electrodes 130e to 130h may be between the second common floating diffusion region 120b and the fifth to eighth photoelectric conversion layers 110e to 110h. On each of the pixel regions PR, the first and second common floating diffusion regions 120a and 120b may be commonly connected through a conductive line (not shown).

The first readout circuit region R2a may be provided thereon with a select transistor (see SX of FIG. 10) and a source follower transistor (see DX of FIG. 10), and the second readout circuit region R2b may be provided thereon with a reset transistor (see RX of FIG. 10) and a dummy transistor.

In detail, the well impurity layer 115 of the first readout circuit region R2a may be provided with a select gate electrode 131 and a source follower gate electrode 133 that are spaced apart from each other. A gate dielectric layer may be interposed between the well impurity layer 115 and each of the select gate electrode 131 and the source follower gate electrode 133.

The well impurity layer 115 of second first readout circuit region R2b may be provided with a reset gate electrode 135 and a dummy gate electrode 137 that are spaced apart from each other. A gate dielectric layer may be interposed between the well impurity layer 115 and each of the reset gate electrode 135 and the dummy gate electrode 137.

N-type source/drain regions 141, 143, 145, 147, and 149 may be provided in the well impurity layer 115 on opposite sides of each of the select gate electrode 131, the source follower gate electrode 133, the reset gate electrode 135, and the dummy gate electrode 137. As discussed above, the n-type impurity regions 141, 143, 145, 147, and 149 may include lightly doped impurity regions 141a, 143a, 145a, 147a, and 149a, respectively, and heavily doped impurity regions 141b, 143b, 145b, 147b, and 149b, respectively.

In the example embodiment shown in FIGS. 11 and 12, as discussed above with reference to FIGS. 6, 7A, and 7B, when the first to eighth photoelectric conversion layers 110a to 110h are integrated with photo-charges, overflowing photo-charges may be drained into the first and second common floating diffusion regions 120a and 120b and also into the source/drain regions 141, 143, 145, 147, and 149 of the first and second readout circuit regions R2a and R2b.

According to some example embodiments of inventive concepts, when photo-charges are generated to exceed the full well capacity of a photodiode, the photo-charges overflowing from the photodiode may be drained into a charge detection node (e.g., a floating diffusion region) and source/drain regions of readout circuit transistors on a readout circuit region. That is, as the overflowing photo-charges are drained through two charge paths, reducing the impact of blooming characteristics without reducing the full well capacity of the photodiode may be possible.

In addition, as there is no need to, or desire to, reduce a potential barrier below a transfer gate in order to improve the blooming characteristics, the photodiode may have an improved distribution of the full well capacity.

Accordingly, more sharp images may be produced on an image sensor according to some embodiments of inventive concepts.

Although the present invention has been described in connection with the embodiments of the present invention illustrated in the accompanying drawings, it will be understood to those skilled in the art that various changes and modifications may be made without departing from the technical spirit and essential feature of the present invention. It will be apparent to those skilled in the art that various substitution, modifications, and changes may be thereto without departing from the scope and spirit of inventive concepts.

What is claimed is:

1. An image sensor, comprising:
   a semiconductor layer of a first conductivity;
   a separation impurity layer of the first conductivity, the separation impurity layer in the semiconductor layer and defining a photoelectric conversion region and a readout circuit region;
   at least one photoelectric conversion layer of a second conductivity, the at least one photoelectric conversion layer in the semiconductor layer of the photoelectric conversion region and surrounded by the separation impurity layer;
   a floating diffusion region of the second conductivity, the floating diffusion region spaced apart from the at least one photoelectric conversion layer and in the semiconductor layer of the photoelectric conversion region;
   a transfer gate electrode between the at least one photoelectric conversion layer and the floating diffusion region; and
   impurity regions of the second conductivity, the impurity regions in the semiconductor layer of the readout circuit region,
   wherein in response to the at least one photoelectric conversion layer being integrated with photo charges, the separation impurity layer has a first potential level around the at least one photoelectric conversion layer and a second potential level on a portion between the at least one photoelectric conversion layer and the impurity regions of the readout circuit region, the second potential level being greater than the first potential level.

2. The image sensor of claim 1, wherein a third potential level of the semiconductor layer under the transfer gate electrode is greater than or equal to the second potential level in response to the at least one photoelectric conversion layer being integrated with photo charges.

3. The image sensor of claim 1, further comprising:
   a source follower gate electrode on the semiconductor layer of the readout circuit region, the impurity regions of the second conductivity being on opposite sides of the source follower gate electrode.

4. The image sensor of claim 3, further comprising:
   a select gate electrode on the semiconductor layer on a side of the source follower gate electrode; and
   a reset gate electrode on an opposite side of the source follower gate electrode.

5. The image sensor of claim 1, wherein an impurity concentration of the second conductivity in the impurity regions has a first concentration, and an impurity concentration of the second conductivity in the photoelectric conversion region has a second concentration, and the first concentration is greater than the second concentration.

6. The image sensor of claim 1, wherein
   the separation impurity layer comprises a first segment between a plurality of photoelectric conversion layers adjacent to one another and a second segment between the photoelectric conversion region and the readout circuit region, and
   the first and second segments have substantially the same impurity concentration of the first conductivity.

7. The image sensor of claim 6, wherein the separation impurity layer is partially between the at least one photoelectric conversion layer and the impurity regions of the second conductivity.

8. The image sensor of claim 1, wherein
   the photoelectric conversion region and the readout circuit region are each in plural,
   the photoelectric conversion regions are adjacent to each other in a first direction, and
   the readout circuit regions are adjacent to the photoelectric conversion regions in a second direction crossing the first direction.

9. The image sensor of claim 1, wherein
   the at least one photoelectric conversion layer comprises a plurality of sub-photoelectric conversion layers, at least some of the plurality of sub-photoelectric conversion layers being surrounded by the separation impurity layer, and
   the sub-photoelectric conversion layers share the floating diffusion region.

10. An image sensor, comprising:
    a semiconductor layer of a first conductivity;
    a separation impurity layer of the first conductivity, the separation impurity layer in the semiconductor layer and defining a photoelectric conversion region and a readout circuit region;
    photoelectric conversion layers of a second conductivity, the photoelectric conversion layers in the semiconductor layer of the photoelectric conversion region and surrounded by the separation impurity layer;
    a floating diffusion region of the second conductivity, the floating diffusion region spaced apart from the photoelectric conversion layers and in the semiconductor layer of the photoelectric conversion region;
    transfer gate electrodes between the photoelectric conversion layers and the floating diffusion region; and
    impurity regions of the second conductivity, the impurity regions in the semiconductor layer of the readout circuit region,
    wherein, in response to the photoelectric conversion layers being integrated with photo-charges, overflowing charges are drained through a first charge path from the photoelectric conversion layers into the floating diffusion region and through a second charge path from the photoelectric conversion layers into the impurity regions of the second conductivity of the readout circuit region.

11. The image sensor of claim 10, wherein
    the separation impurity layer comprises a first segment between the photoelectric conversion layers adjacent to one another and a second segment between the photoelectric conversion region and the readout circuit region, the second segment crossing the first segment, and
    wherein the second charge path is partially on the second segment of the separation impurity layer.

12. The image sensor of claim 10, wherein an impurity concentration of the second conductivity is greater in the impurity regions than in the photoelectric conversion layers.

13. The image sensor of claim 10, wherein, in response to the photoelectric conversion layers being integrated with the photo-charges, the separation impurity layer has a first potential level around the photoelectric conversion layers and a second potential level on a portion between the photoelectric conversion layers and the impurity regions of the readout circuit region, the second potential level being greater than the first potential level.

14. The image sensor of claim 13, wherein, in response to the photoelectric conversion layers being integrated with photo-charges, the semiconductor layer has a third potential level under the transfer gate electrodes, the second potential level less than the third potential level.

15. The image sensor of claim 10, further comprising:
a source follower gate electrode on the semiconductor layer of the readout circuit region,
wherein the impurity regions of the second conductivity are on opposite sides of the source follower gate electrode.

16. An image sensor, comprising:
a semiconductor layer of a first conductivity;
a separation impurity layer of the first conductivity, the separation impurity layer in the semiconductor layer and defining a photoelectric conversion region and a readout circuit region;
a first photoelectric conversion layer of a second conductivity, the first photoelectric conversion layer in the semiconductor layer of the photoelectric conversion region and surrounded by the separation impurity layer;
a second photoelectric conversion layer of the second conductivity, the second photoelectric conversion layer in the semiconductor layer of the photoelectric conversion region, the second photoelectric conversion layer adjacent to the first photoelectric conversion layer;
a first common floating diffusion region of the second conductivity, the first common floating diffusion region spaced apart from the first photoelectric conversion layer and the second photoelectric conversion layer;
a first transfer gate electrode between the first photoelectric conversion layer and the first common floating diffusion region;
a second transfer gate electrode between the second photoelectric conversion layer and the first common floating diffusion region; and
impurity regions of the second conductivity, the impurity regions in the semiconductor layer of the readout circuit region,
the first photoelectric conversion layer and the second photoelectric conversion layer not being separated by an insulating layer.

17. The image sensor of claim 16, further comprising:
a third photoelectric conversion layer of the second conductivity, the third photoelectric conversion layer in the semiconductor layer of the photoelectric conversion region, the third photoelectric conversion layer and the second photoelectric conversion layer not being separated by the insulating layer;
a third transfer gate electrode between the third photoelectric conversion layer and the first common floating diffusion region;
a fourth photoelectric conversion layer of the second conductivity, the fourth photoelectric conversion layer in the semiconductor layer of the photoelectric conversion region, the fourth photoelectric conversion layer and the third photoelectric conversion layer not being separated by the insulating layer; and
a fourth transfer gate electrode between the fourth photoelectric conversion layer and the first common floating diffusion region.

18. The image sensor of claim 16, further comprising:
a second common floating diffusion region of the second conductivity, the second common floating diffusion region spaced apart from the first photoelectric conversion layer and the second photoelectric conversion layer;
a third photoelectric conversion layer of the second conductivity, the third photoelectric conversion layer in the semiconductor layer of the photoelectric conversion region; and
a third transfer gate electrode between the third photoelectric conversion layer and the second common floating diffusion region,
the first photoelectric conversion layer and the third photoelectric conversion layer not being separated by the insulating layer.

19. The image sensor of claim 16, further comprising:
a first source/drain region of the second conductivity on the semiconductor layer of the readout circuit region, the first source/drain region and the first photoelectric conversion layer not being separated by the insulating layer.

20. The image sensor of claim 19, further comprising:
a second source/drain region of the second conductivity on the semiconductor layer of the readout circuit region, the second source/drain region and the first photoelectric conversion layer being separated by a device isolation layer.

* * * * *